United States Patent [19]
Inoue et al.

[11] Patent Number: 5,204,544
[45] Date of Patent: Apr. 20, 1993

[54] PHOTOELECTRIC CONVERSION DEVICE WITH STABILIZING ELECTRODE

[75] Inventors: Shunsuke Inoue, Hiratsuka; Shiro Arikawa, Atsugi, both of Japan

[73] Assignee: Canon Kabushiki Kaisha, Tokyo, Japan

[21] Appl. No.: 839,074

[22] Filed: Feb. 24, 1992

Related U.S. Application Data

[63] Continuation of Ser. No. 570,982, Aug. 23, 1990, abandoned, which is a continuation of Ser. No. 213,922, Jun. 30, 1988, abandoned.

[30] Foreign Application Priority Data

Jul. 3, 1987 [JP] Japan .................. 62-165523

[51] Int. Cl.$^5$ .................. H01L 29/78; H01L 27/14; H01L 31/10
[52] U.S. Cl. .................. 257/462; 257/291; 257/435
[58] Field of Search .................. 357/30, 31, 32, 34

[56] References Cited

U.S. PATENT DOCUMENTS

| | | | |
|---|---|---|---|
| 4,363,963 | 12/1982 | Ando | 357/31 |
| 4,589,003 | 5/1986 | Yamada et al. | 357/31 |
| 4,686,554 | 8/1987 | Ohmi et al. | 357/34 |

OTHER PUBLICATIONS

"SIT (Static Induction Transistor) and its Application to Imaging Device" by J. Nishizawa et al., Television Technology Report, Research Institute of Electrical Communication, Tohoku University, Aug. 28, 1991, pp. 53-58.

Primary Examiner—Jerome Jackson, Jr.
Attorney, Agent, or Firm—Fitzpatrick, Cella, Harper & Scinto

[57] ABSTRACT

A photoelectric conversion device has a semiconductor region for accumulating the carriers generated by photoexcitation which reads the signals according to the accumulated carriers in said semiconductor region. A stabilizing electrode is provided above the surface where the semiconductor region is formed.

16 Claims, 5 Drawing Sheets

(A)

(B)

(A)

(B)

(D)

PHOTOELECTRIC CONVERSION DEVICE WITH STABILIZING ELECTRODE

This application is a continuation of application Ser. No. 07/570,982 filed Aug. 23, 1990 now abandoned which is a continuation of application Ser. No. 07/213,922 filed Jun. 30, 1988, now abandoned.

BACKGROUND OF THE INVENTION

1. Field of the Invention

This invention relates to a photoelectric conversion device having a semiconductor region for accumulating carriers generated by photoexcitation, which device reads the signals according to the accumulated carriers in said semiconductor region.

2. Related Background Art

FIG. 1(A) is a schematic sectional view of one example of the photoelectric conversion device of the prior art, and FIG. 1(B) is its equivalent circuit diagram.

In each Figure, photoelectric conversion cells are arranged on n silicon substrate 101, and each cell is electrically insulated from adjacent cells with an element separating device (not shown) consisting of SiO$_2$, Si$_3$N$_4$ or polysilicon, etc.

Each cell has the constitution as described below.

In the n$^-$ region 102 with low impurity concentration formed by epitaxial technique, etc., a p base region 103 and a n$^+$ emitter region 104 are formed to constitute a bipolar transistor. Further, on the p base region 103, a capacitor electrode 106 is formed with an oxide film 105 sandwiched therebetween to constitute a capacitor Cox for controlling base potential as opposed to the p base region.

Also, p$^+$ regions 107 and 108, and a gate electrode with the oxide film 105 sandwiched therebetween are formed to constitute a PMOS transistor for performing refresh actuators.

Otherwise, there are formed an emitter electrode 110 connected to the n$^+$ emitter region 104, an electrode 111 connected to the p$^+$ region 108, and a collector electrode 112 on the back of the substrate 110 with an ohmic contact layer sandwiched therebetween, respectively.

Next, the actuation of the above photoelectric conversion device will now be described.

Light is incident from the side of the p base region 103. Carriers (here holes) corresponding to the dose of incident light are accumulated in the p base region (accumulated actuation).

The base potential is changed by the carriers accumulated, and by reading its potential change from the emitter electrode 110, electrical signals corresponding to the incident dose can be obtained. Specifically, the emitter electrode 110 is maintained under floating state with a positive voltage being applied on the capacitor electrode 106. By this, the base potential is elevated to apply 1 bias in the ordinary direction between the base the emitter, and the accumulated voltage in the base being read from the emitter side (reading actuation). Even when the reading actuation may be completed, since the accumulated carriers in the p base region are not substantially reduced, the same signal can be read repeatedly (non-destructive reading).

To perform a refresh actuation which eliminates the holes accumulated in the p base region 103, the emitter electrode 110 is grounded and simultaneously the electrode 111 is maintained at a constant potential.

At first, a negative voltage is applied on the gate electrode 109 to turn on the pMOS transistor Qc. As a result the potential in the p base region 103 becomes a constant value regardless of whether the accumulated potential is high or low.

Subsequently, by applying a positive pulse for refresh on the capacitor electrode 106, a bias is applied in the ordinary direction between the base and the emitter as a result the accumulated holes are eliminated through the grounded electrode 110. When the refresh pulse has risen, the p base region 103 is returned to the initial state of a negative potential (refresh actuation).

Thus, after the potential in the p base region 103 is made at a constant potential by the MOS transistor Qc, a refresh pulse is applied to erase the residual charges, and therefore fresh accumulation can be effected without dependence on the accumulated potential of the previous time. Also, the residual charges can be extinguished rapidly, whereby high speed actuation is rendered possible.

Thereafter, the respective actuations of accumulation, reading, refresh are similarly repeated.

The capacitor Cox may be sometimes not required to be provided, and photoelectric conversion reading can be performed also in the case of a photoelectric conversion cell in which only the transistor Qc is electrically connected to the base region 103.

However, the photoelectric conversion device of the prior art as described above has the following problems.

The surface of the base region 103 has a relatively lower impurity concentration for realizing a high Hfe, and therefore was susceptible to the influence from the potential on the cell surface through the oxide film 105 to be unstable.

Further, the surface recombination current is generated from the silicon surface, and this current is greatly dependent on the surface potential. For this reason, in the photoelectric conversion device having a base region 103 with unstable surface, dark current caused by the above surface recombination current is greatly different between the cells to become a cause for noise.

SUMMARY OF THE INVENTION

Accordingly, an object of the present invention is to provide a photoelectric conversion device, which can stabilize electrically the surface layer which generates surface recombination current and can obtain photoelectric conversion signals without variance.

Another object of the present invention is to provide an improved photoelectric conversion device which has solved the problems possessed by the photoelectric conversion device of the prior art as described above.

Still another object of the present invention is to provide a photoelectric conversion device which can effect photoelectric conversion constantly stably without receiving the influence from the potential of the cell surface.

Still another object of the present invention is to provide a photoelectric conversion device with the dark current substantially unchanged between the cells and substantially without noise.

Still another object of the present invention is to provide a photoelectric conversion device having a semiconductor region for accumulating the carriers generated by photoexcitation which reads the signals according to the accumulated carriers in said semiconductor region, characterized in that a stabilizing electrode is provided above the reference where said semiconductor region is formed.

DETAILED DESCRIPTION OF THE PREFERRED EMBODIMENTS

In the photoelectric conversion device of the present invention, by providing a stabilizing electrode above the surface of the semiconductor region for accumulating the carriers generated by photoexcitation and maintaining the stabilizing electrode at a constant potential, the surface potential in the above semiconductor is stabilized.

By making the above stabilizing electrode at a constant potential, the surface potential of the above semiconductor region can be stabilized to inhibit the influence from an external disturbance. Accordingly, generation of the dark current can be inhibited, and the noise of reading signals due to variance in the dark current can be inhibited.

Also, even if the above stabilized electrode may be maintained in the floating state, provided that it has sufficiently greater area as compared with the photoelectric conversion device, the surface potential of the above semiconductor region can be sufficiently stabilized.

As the above stabilizing electrode, for example, a transparent electrode such as ITO, $SNO_2$, etc. or polysilicon, etc. can be used.

By use of a transparent electrode, the above effect can be obtained without changing the photoelectric conversion characteristics in the visible light region.

By use of a polysilicon, a photoelectric conversion device for detection of IR-ray can be obtained as described below. In this case, since there is conformity with the conventional semiconductor process, there is the advantage that preparation can be simpler as compared with the case of using a transparent electrode.

Now, preferred embodiments of the present invention are described in detail by referring to the accompanying drawings.

Figure 1:
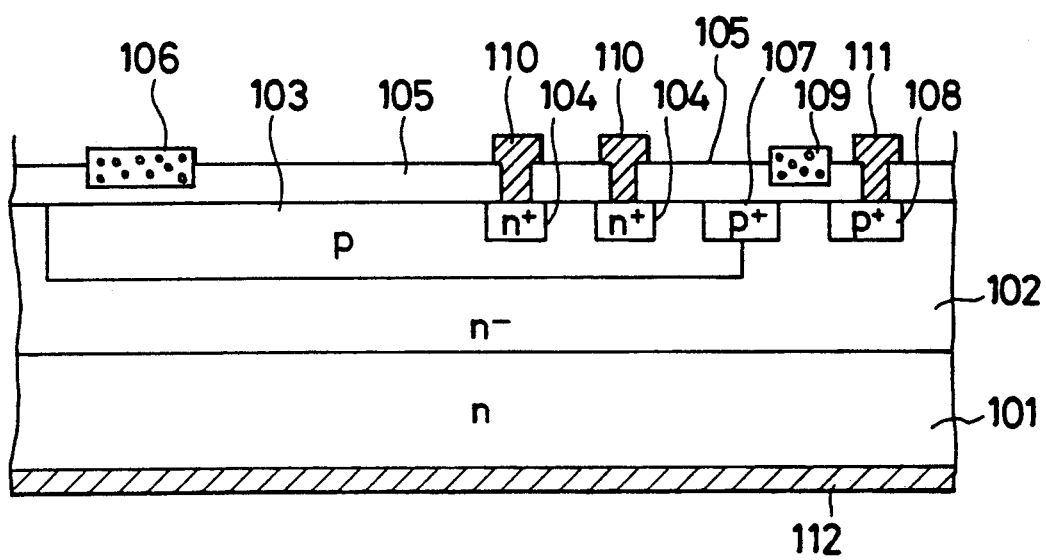
FIG. 1(A) is a schematic sectional view of the photoelectric conversion device of the prior art, and FIG. 1(B) a diagram of its equivalent circuit.
Figure 1:
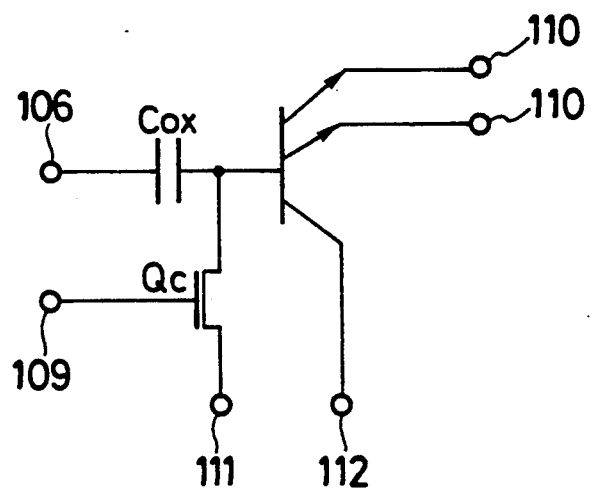
Figure 2:
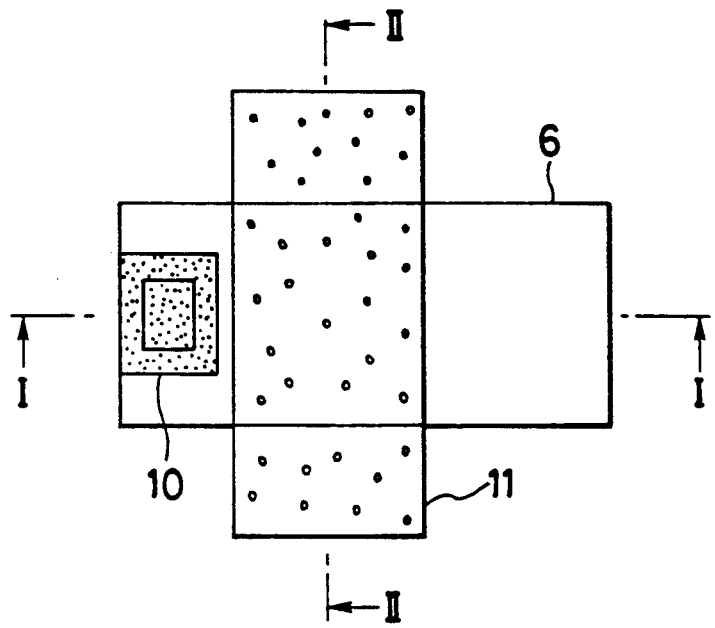
Fig. 2(A) is a schematic plan view of a first preferred embodiment of the photoelectric conversion device according to the present invention, FIG. 2(B) a schematic cross-sectional view cut along the line I—I in FIG. 2(A) and FIG. 2(C) a schematic cross sectional-view cut along the line II—II in FIG. 2(A).
Figure 2:
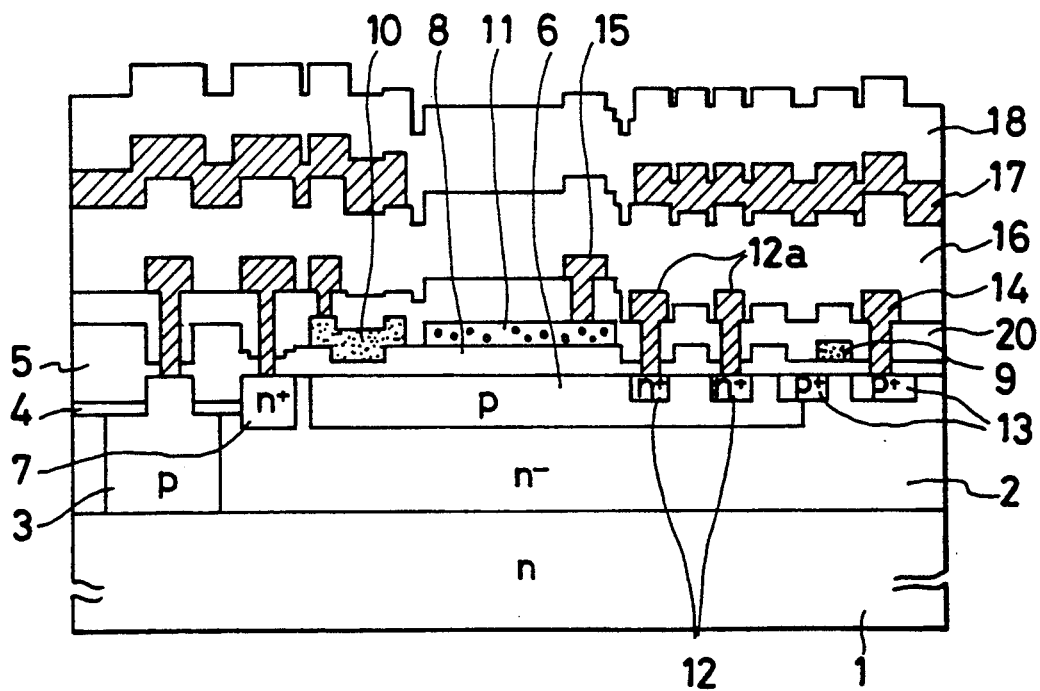
Figure 2:
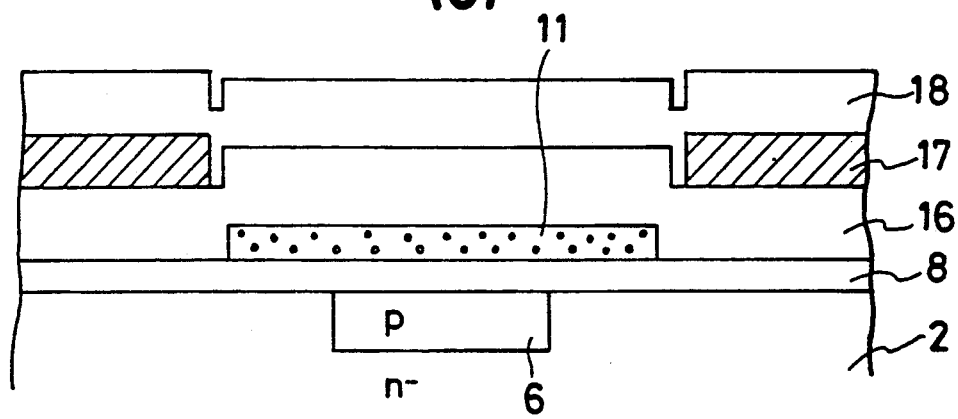

FIG. 2(A) is a schematic plan view of a first preferred embodiment of the photoelectric conversion device according to the present invention, FIG. 2(B) a cross-sectional view cut along its I—I line and FIG. 2(C) a partial cross-sectional view cut along its II—II line. The equivalent circuit of this embodiment is the same as shown in FIG. 1(B).

The bipolar transistor for effecting photoelectric conversion is constituted of a n⁻ collector region 2, a p base region 6 and n⁺ emitter region 12, and the capacitor electrode 10 for performing the respective actuations by controlling the base potential is opposed to the p base region 6 with an oxide film 8 sandwiched therebetween. The respective actuations of accumulation, reading and refresh in this embodiment are as already described.

Figure 3:
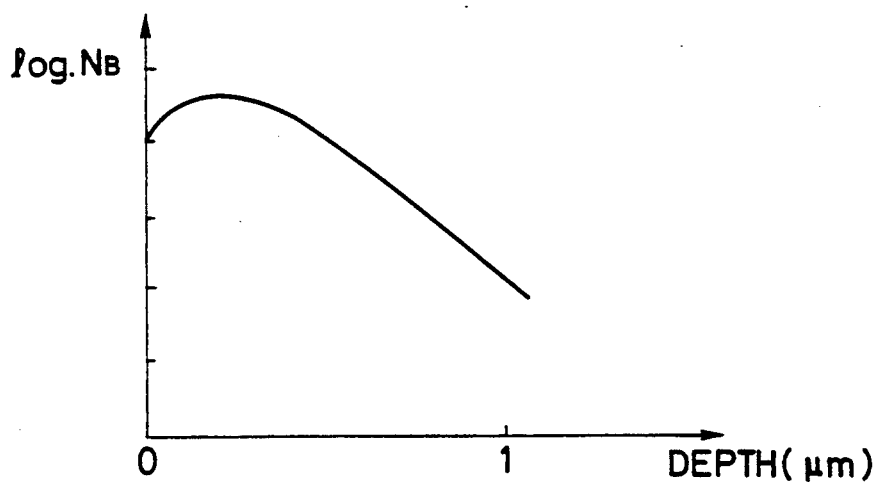
FIG. 3 is a graph showing the impurity profile in the p base region 6.

FIG. 3 is a graph showing the impurity profile in the p base region 6.

The p base region is formed by the ion implantation method as described below, and it is formed at a lower concentration than the base concentration in conventional bipolar transistor for ensuring non-destructive readability.

The impurity profile shown in FIG. 3 is that of the base region 6 which is formed at a dose amount of $1 \times 10^{12}$ to $10^{13}/cm^2$, followed by completion of all the subsequent steps.

As shown in the same graph, the concentration peak occurs at the position deeper than the surface, and the surface becomes a state approximate to a genuine semiconductor.

However, in the state of the silicon surface approximate to a genuine semiconductor, surface recombination current shown by Schockley-Read-Hall theory becomes is liable to be generated. Such surface recombination current becomes the dark current in a photoelectric conversion device to cause deterioration of characteristics to occur. Besides, since the recombination current depends greatly on the potential of the surface, it is strongly subject to influence from external disturbance, etc. to appear as a variance in the dark current, and therefore variance in reading signals.

Accordingly, by utilizing the fact that recombination current depends on surface potential, in this embodiment, a stabilizing electrode 11 for stabilizing the dark current by controlling the potential on the silicon surface is provided.

The stabilizing electrode 11, as shown in FIGS. 2(A) and (C), is provided on a part of the surface of the p base region 6 and the surface of the n-collector region 2 therearound. In this embodiment, the material for the stabilizing electrode 11 is a transparent electrode material such as ITO, $SnO_2$, etc.

Figure 4:
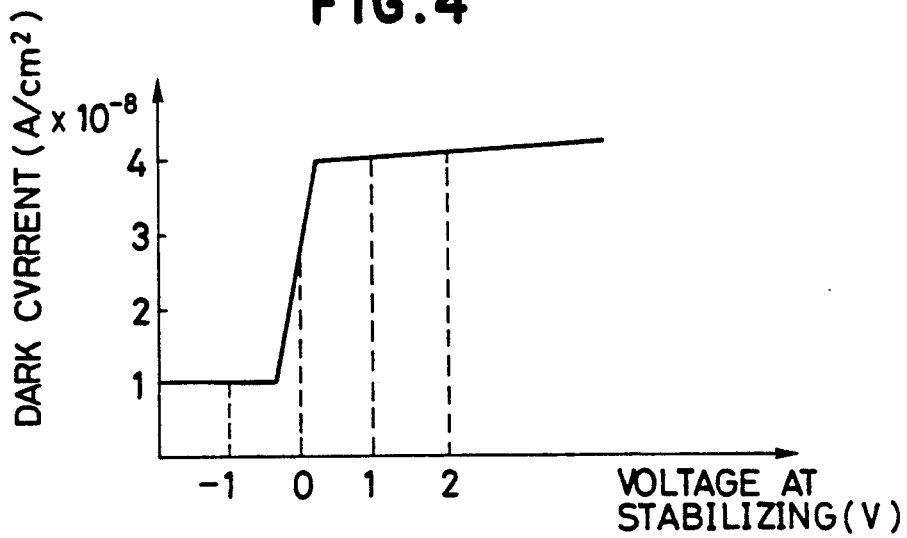
Fig. 4 is a graph showing the change in dark current versus the potential of the stabilizing electrode 11.

FIG. 4 is a graph showing the change in the dark current versus potential of the stabilizing electrode 11.

As show in this graph, under the no control state (0 V) where no voltage is applied on the stabilizing electrode 11, dark current is greatly changed by an external disturbance, but when the surface potential is stabilized by maintaining the control voltage at $-1$ V or less, the dark current is inhibited to a small valve, and without change due to an external disturbance. By actuation under this state, reading signals with little variance can be outputted stably.

Also, even if the stabilizing electrode 11 may be maintained at the electrically floating state without being maintained at a constant voltage, provided that the surface is made sufficiently greater as compared with the cell region, it is possible to stabilize sufficiently the silicon surface relative to an external disturbance.

In the following, the preparation method of the present invention is described.

FIGS. 5(A)–(D) illustrate schematically the preparation steps showing a part of the preparation steps of the embodiment shown in FIGS. 2(A) to (C).

Figure 5:
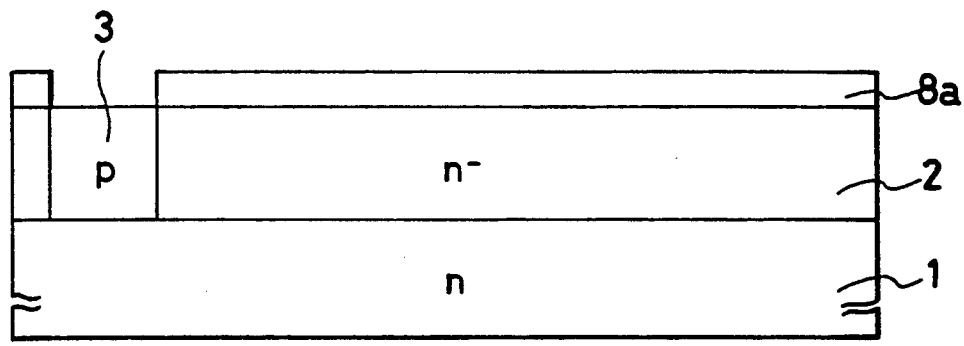
FIGS. 5(A)–(D) are schematic illustration of the preparation steps showing a part of the preparation steps of the embodiment shown in FIGS. 2(A)–(C).
Figure 5:
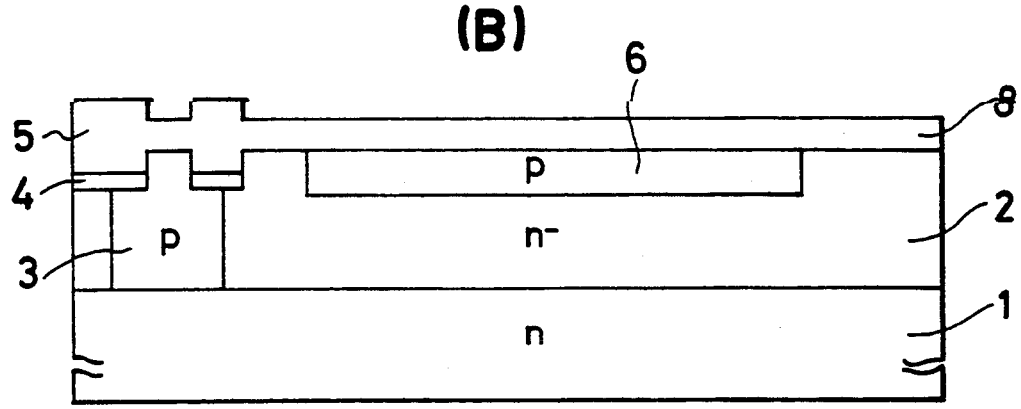
Figure 5:
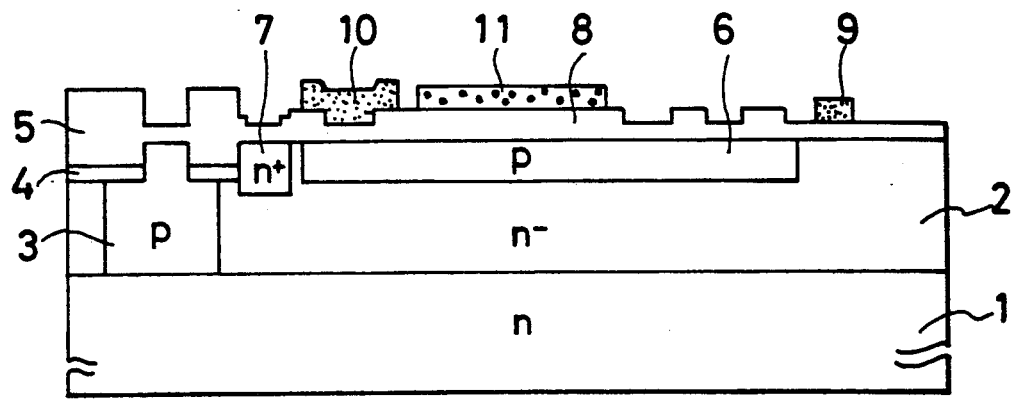
Figure 5:
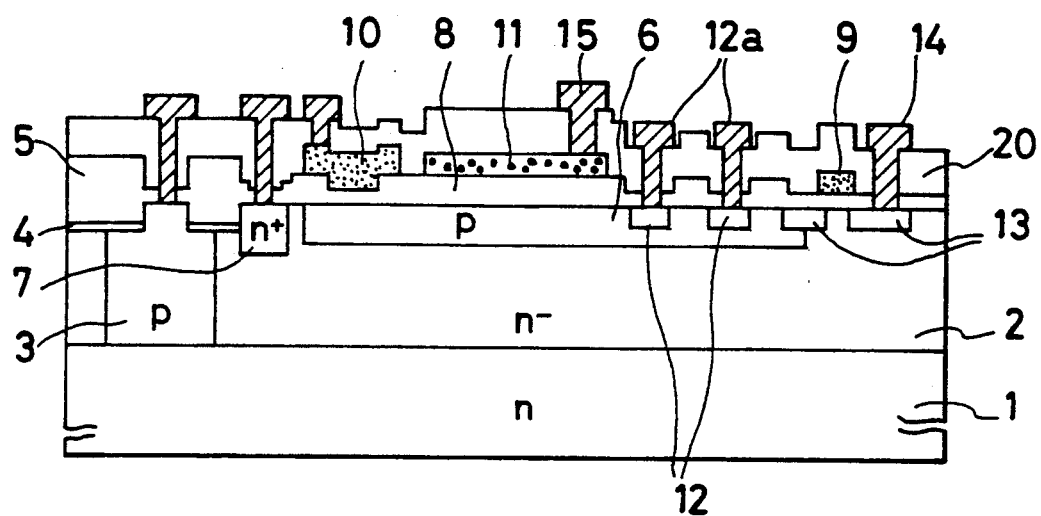

As shown in FIG. 5(A), n⁻ region 2 with a thickness of 5 to 10 μm is formed by epitaxial growth on the n-type silicon substrate 1.

Subsequently, after formation of the oxide film 8a by oxidation of the surface, the oxide film 8a where p well region is desired to be formed is removed by patterning.

Subsequently, with the oxide film 8a as the mask, boron ions are implanted and the p well region 3 is formed by diffusion by heat treatment. The p well region 3 is a region necessary for formation of NMOS of the circumferential circuit of the photoelectric conversion portion.

Next, after the oxide film 8a was removed from the whole surface, oxidation is again effected, and further by selective oxidation, etc. by use of a silicon nitride film of 500 to 2000 Å, a n⁺ channel stop region 4 and a thick oxide film 5 are selectively formed as shown in FIG. 5(B).

Subsequently, after coating of a resistor, the portion where the base region is desired to be formed is removed by patterning. Boron ions are then implanted with the resist as the mask, and the p base region 6 is formed by heat treatment.

The dose during the ion implantation is about $1 \times 10^{12}$ to $10^{14}/cm^2$, and the surface concentration about $10^{15}$ to $10^{19}/cm^3$.

The impurity profile is as shown in FIG. 3. Thus, by use of boron as the impurity, although the flight of ions is set toward the oxide film side from the interface between the oxide film which is the buffer layer and the n⁻ region 2, the peak with concentration N is formed through local precipitation of boron ions, whereby the surface becomes the state approximate to genuine semiconductor.

At the stage when the p base region 6 is formed, the thickness of the oxide film 8 formed thereon is about 1500 to 4000 Å.

Next, as shown in FIG. 5(C), n⁺ region 7 is formed by ion implantation or phosphorus deposition with POCl₃, etc. Through the n⁺ region 7, electrical connection to n⁻ region 2 can be obtained, and it also becomes the portion for forming the collector necessary for reading circuit.

Subsequently, after the portion constituting the capacitor Cox and the portion of MOS transistor Qc, a thin gate oxide film with a thickness of about 150 to 600 Å is formed. And, a material such as a polysilicon, a high melting metal or metal silicide, etc. is deposited and subjected to patterning to form a gate electrode 9 and a capacitor electrode 10.

The capacitor Cox is not necessarily required to be provided, but the capacitor Cox may be provided, if desired.

Subsequently, a material such as ITO, SnO₂, etc. is deposited according to the CVD method, the sputtering method, etc., followed by patterning to form a stabilizing electrode. The stabilizing electrode, as shown in FIGS. 2(A) and (C), may cover a part of the p-base region and a part of the surface of the n⁻ region 2, or the whole region or only one of the regions.

As described above, the gate electrode 9 and the capacitor electrode 10 should desirably be formed prior to formation of the stabilizing electrode from the standpoint of ensuring the characteristics at the interface between the gate and the gate film, but it is also possible to form them in the reverse order.

Next, as shown in FIG. 5(D), according to the method such as ion injection, etc., after formation of the n⁺ emitter region 12 and the p⁺ region 13 which is the source-drain region of the PMOS transistor Qc, an insulating film 20 such as SiO₂, PSG, BPSG, etc. is formed according to the CVD method. The insulating film 20 is then subjected to patterning to open a contact hole, and the emitter electrode 12a, the electrode 14 for the transistor Qc and the electrode 15 connected to the stabilizing electrode 11, and other electrodes are respectively formed.

Subsequently, an interlayer insulating film 16 such as silicon nitride film, PSG, etc., a light-intercepting film 17 and a passivation film 18 are successively formed to obtain a structure as shown in FIG. 3(B).

Figure 6:
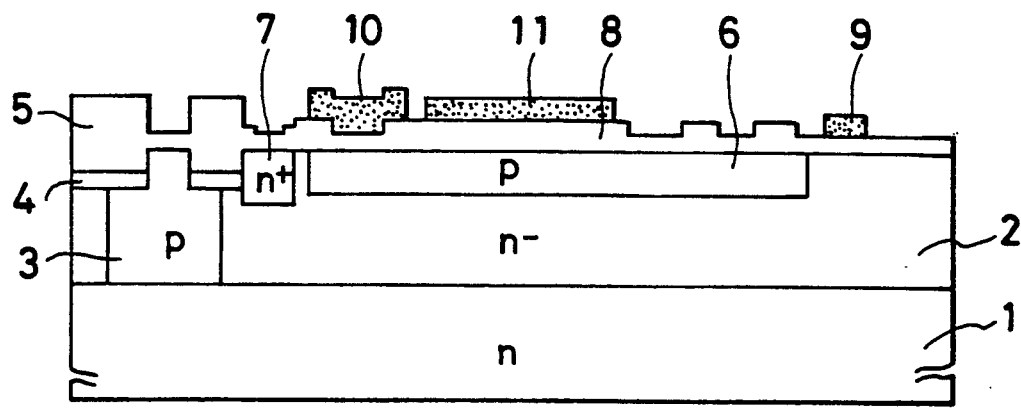
FIG. 6 is schematic illustration of one step in the preparation steps of a second preferred embodiment of the present invention.

FIG. 6 is a schematic illustration of one step in the preparation steps of a second preferred embodiment of the present invention.

This embodiment is intended primarily to detection of IR-ray, and therefore the material of the stabilizing electrode 11 is not required to be transparent in the visible light region. In this embodiment, a polysilicon was employed.

A polysilicon with a thickness of about 0.4 μm can permit only about 6% of blue light (λ=4500 Å) to transmit therethrough, but can permit about 100% of IR light (λ10000 Å) to transmit therethrough.

The preparation steps of this embodiment are the same as those in the first embodiment except for the stabilizing electrode of the polysilicon. Accordingly, only the step shown in FIG. 6 is replaced with the step shown in FIG. 5(C).

In FIG. 6, after formation of the p base region 6 and the n⁺ region 7, the oxide film 8 at the capacitor portion, the emitter portion and the transistor Qc portion is removed by patterning, and a thin gate oxide film is formed by oxidation.

Subsequently, the polysilicon is deposited by the LPCVD method, and after introduction of an impurity according to the ion implantation, thermal diffusion, etc., patterning is effected to form a gate electrode, a capacitor electrode 10 and a stabilizing electrode 11.

Following subsequently the steps as described in FIG. 5(D), this embodiment can be constituted.

Thus, in this embodiment, since the stabilizing electrode 11 is a polysilicon, it can be formed simultaneously according to the formation steps of the gate electrode 9 and the capacitor electrode 10, whereby the preparation steps can be simplified as compared with the case of the first embodiment.

The effect of this embodiment is the same as that of the first embodiment except for aiming at detection of IR-ray. That is, dark current and its fluctuation can be inhibited by the stabilizing electrode 11.

Also, in this embodiment, the capacitor may be provided, if desired.

In the above respective embodiments, the case of npn bipolar transistor was shown, which, however, is not limittive of the present invention, as a matter of course. The present invention is also applicable for the pnp type, and further applicable for photoelectric conversion devices of other systems which accumulate photo-excited carriers.

As described in detail above, since the photoelectric conversion device has a stabilizing electrode, by controlling this at a constant potential, the surface potential in the semiconductor region can be stabilized, and also the influence from the external disturbance can be inhibited. For this reason, generation of dark current can be controlled, and the noise of the reading signals due to variance of dark current can be inhibited.

Also, even when the above stabilizing electrode may be maintained at a floating state, provided that it has sufficiently larger area as compared with the photoelectric conversion device, the surface potential in the above semiconductor region can be sufficiently stabilized.

What is claimed is:

1. A photoelectric conversion device comprising:
   a first region of a first conductivity type;
   a second region of a second conductivity type disposed adjacent to said first region;
   a third region of the first conductivity type provided within said second region;
   a fourth region of the second conductivity type electrically connected to said second region;
   fifth region of the second conductivity type disposed adjacent to said first region;
   an electrode electrically connected to said first region;
   a gate electrode, wherein an insulating layer region is disposed between said gate electrode and a channel region, said channel region being defined by said fourth and fifth regions;
   a stabilizing electrode, wherein an insulating layer region is disposed between said stabilizing electrode, and said first and second regions; and
   a control electrode for biasing a junction between said second region and said third region, wherein an insulating layer region is disposed between said second region and said control electrode.

2. A photoelectric conversion device according to claim 1, wherein the first conductivity type is n-type, and the second conductivity type is p-type.

3. A photoelectric conversion device according to claim 1, wherein said stabilizing electrode comprises a transparent electrode material.

4. A photoelectric conversion device according to claim 3, wherein said transparent electrode is of a material selected from the group consisting of ITO and $SnO_2$.

5. A photoelectric conversion device according to claim 1, wherein said stabilizing electrode comprises a material transparent to infrared light.

6. A photoelectric conversion device according to claim 5, wherein said material transparent to the infrared light includes polysilicon.

7. A photoelectric conversion device according to claim 1, further comprising, a plurality of such third regions.

8. A photoelectric conversion device according to claim 1, wherein said third region is an emitter region.

9. A photoelectric conversion device according to claim 1, wherein said first region is provided on a semiconductor substrate.

10. A photoelectric conversion device according to claim 1, wherein said control electrode is a material selected from the group consisting of polysilicon, metal of a high melting point and metal silicide.

11. A photoelectric conversion device according to claim 1, further comprising a light shield film provided on at least a portion of said photoelectric conversion device that is not substantially over said stabilizing electrode.

12. A photoelectric conversion device according to claim 1, further comprising a passivation film.

13. A photoelectric conversion device according to claim 1, further comprising:
   an insulating film; and
   a passivation film, wherein said insulating film and said passivation film are formed on said stabilizing electrode.

14. A photoelectric conversion device according to claim 1, wherein said electrode is connected by an ohmic contact layer to said first region.

15. A photoelectric conversion device according to claim 1, wherein said first region is $n^-$-type, said second region is p-type, said third region is $n^+$-type, and said fourth and fifth regions are each $p^+$-type.

16. A photoelectric conversion device according to claim 1, wherein
   said first region includes an n type substrate (1) and an $n^-$ region with an impurity concentration lower than that of said n type substrate.

* * * * *

UNITED STATES PATENT AND TRADEMARK OFFICE
CERTIFICATE OF CORRECTION

PATENT NO. : 5,204,544

DATED : April 20, 1993

INVENTOR(S) : SHUNSUKE INOUE, ET AL.

It is certified that error appears in the above-identified patent and that said Letters Patent is hereby corrected as shown below:

COLUMN 1

Line 24, "$SiO_2$," should read --$SiO_2$,--.
Line 38, "actuators." should read --actuations.--.
Line 42, "substrate 110" should read --substrate 101--.
Line 58, "1 bias" should read --a bias-- and "base" should read --base and--.
Line 59, "and" should be deleted.
Line 65, "actuation" should read --actuation,--.

COLUMN 2

Line 8, "emitter as" should read --emitter. As--.

COLUMN 3

Line 1, "reference" should read --surface--.
Line 12, "cross sectional-" should read --cross-sectional--.
Line 18, "FIGS. 5(A)-(D)" should read --FIGS. 5(A)-5(D)--.
Line 20, "FIGS. 2(A)-(C)." should read --FIGS. 2(A)-2(C).--.
Line 34, "making" should read --maintaining--.

COLUMN 4

Line 28, "becomes" should be deleted.
Line 49, "show" should read --shown--.
Line 54, "valve," should read --value,--.

UNITED STATES PATENT AND TRADEMARK OFFICE
CERTIFICATE OF CORRECTION

PATENT NO. : 5,204,544

DATED : April 20, 1993

INVENTOR(S) : SHUNSUKE INOUE, ET AL.

It is certified that error appears in the above-identified patent and that said Letters Patent is hereby corrected as shown below:

<u>COLUMN 6</u>

Line 13, "FIG. 3(B)." should read --FIG. 2(B).--.
   Line 17, "to" should read --for--.
   Line 25, "($\lambda$ 10000 Å)" should read --($\lambda$=10000 Å)--.
   Line 58, "limittive" should read --limitative--.

<u>COLUMN 7</u>

Line 19, "fifth" should read --a fifth--.

<u>COLUMN 8</u>

Line 8, "comprising," should read --comprising--.
   Line 41, "(1)" should be deleted.

Signed and Sealed this

Twenty-second Day of March, 1994

*Attest:*

BRUCE LEHMAN

*Attesting Officer*     *Commissioner of Patents and Trademarks*